(12) United States Patent
Sakamoto et al.

(10) Patent No.: US 10,681,807 B2
(45) Date of Patent: Jun. 9, 2020

(54) CORELESS SUBSTRATE PREPREG, CORELESS SUBSTRATE, CORELESS SUBSTRATE MANUFACTURING METHOD AND SEMICONDUCTOR PACKAGE

(71) Applicant: HITACHI CHEMICAL COMPANY, LTD., Tokyo (JP)

(72) Inventors: Norihiko Sakamoto, Tokyo (JP); Hiroshi Yokota, Tokyo (JP); Shintaro Hashimoto, Tokyo (JP); Katsuhiko Nawate, Tokyo (JP); Shinji Tsuchikawa, Tokyo (JP); Shin Takanezawa, Tokyo (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 16/499,448

(22) PCT Filed: Mar. 28, 2018

(86) PCT No.: PCT/JP2018/012846
§ 371 (c)(1),
(2) Date: Oct. 25, 2019

(87) PCT Pub. No.: WO2018/181516
PCT Pub. Date: Oct. 4, 2018

(65) Prior Publication Data
US 2020/0107437 A1    Apr. 2, 2020

(30) Foreign Application Priority Data

Mar. 29, 2017   (JP) .................... 2017-066371

(51) Int. Cl.
*H05K 1/03*     (2006.01)
*H05K 3/46*     (2006.01)
*C08J 5/24*     (2006.01)

(52) U.S. Cl.
CPC ............. *H05K 1/036* (2013.01); *C08J 5/24* (2013.01); *H05K 1/0373* (2013.01); *H05K 3/4632* (2013.01)

(58) Field of Classification Search
CPC .... H05K 1/036; H05K 3/4632; H05K 1/0373; C08J 5/24
(Continued)

(56) References Cited

U.S. PATENT DOCUMENTS

| 4,410,666 | A | * | 10/1983 | Ikeguchi | ................ C08G 73/00 525/417 |
| 6,287,696 | B1 | * | 9/2001 | Noda | ......................... C08J 5/24 428/411.1 |

(Continued)

FOREIGN PATENT DOCUMENTS

| JP | 2002-026171 A | 1/2002 |
| JP | 2005-072085 A | 3/2005 |

(Continued)

OTHER PUBLICATIONS

Gicho Business Comunications, Inc., May 11, 2015, [retrieval date Jun. 8, 2018], internet <URL:http://www.busicompost.com/report.html?sno=3&mo=201505 11110155&rcd=0>, (Busicom Post Technical Report), non-official translation (Takagi, Kiyoshi, Recent trend of printed wire board technology) (Cited in ISR).

*Primary Examiner* — Sherman Ng
(74) *Attorney, Agent, or Firm* — Fitch, Even, Tabin & Flannery, LLP

(57) ABSTRACT

The present invention provides a prepreg for a coreless substrate including a thermosetting resin composition containing (a) (meth)acrylic elastomer, (b) an amine compound having at least two primary amino groups, and (c) a maleimide compound having at least two N-substituted maleimide groups, and a coreless substrate using the same, a method of
(Continued)

manufacturing the coreless substrate, and a semiconductor package.

9 Claims, 1 Drawing Sheet

(58) Field of Classification Search
USPC .......................................................... 174/255
See application file for complete search history.

(56) References Cited

U.S. PATENT DOCUMENTS

| | | | |
|---|---|---|---|
| 2009/0110938 A1* | 4/2009 | Nishimura | B32B 15/14 |
| | | | 428/425.8 |
| 2010/0143728 A1* | 6/2010 | Tsuchikawa | C08G 59/4042 |
| | | | 428/457 |
| 2012/0276392 A1* | 11/2012 | Takahashi | B32B 15/08 |
| | | | 428/418 |
| 2014/0192501 A1* | 7/2014 | Kotake | C08G 73/106 |
| | | | 361/783 |
| 2015/0282302 A1 | 10/2015 | Hoshi et al. | |

FOREIGN PATENT DOCUMENTS

| | | |
|---|---|---|
| JP | 2009-231222 A | 10/2009 |
| JP | 2014-146761 A | 8/2014 |
| JP | 2015-189834 A | 11/2015 |
| JP | 2016-190966 A | 11/2016 |
| JP | 2016-196549 A | 11/2016 |
| WO | 2014/132947 A1 | 9/2014 |

* cited by examiner

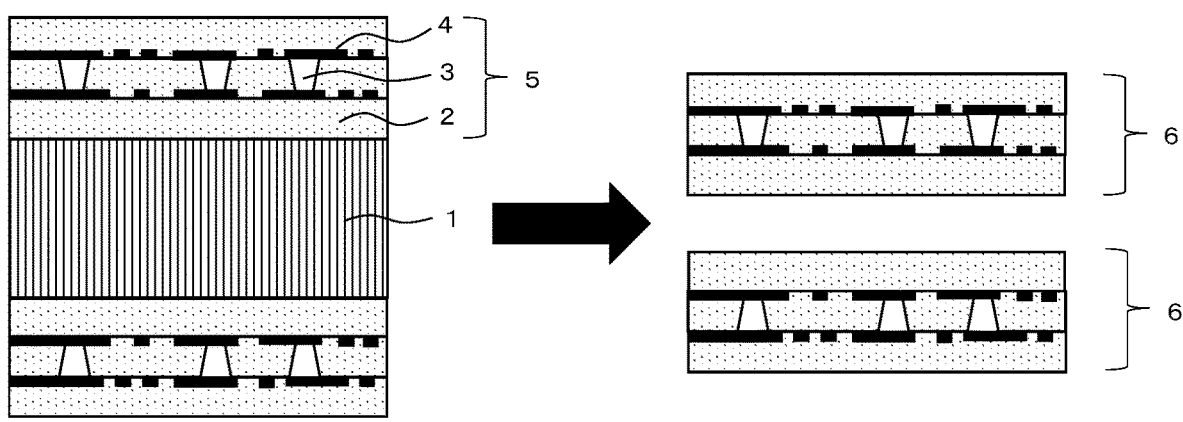

CORELESS SUBSTRATE PREPREG, CORELESS SUBSTRATE, CORELESS SUBSTRATE MANUFACTURING METHOD AND SEMICONDUCTOR PACKAGE

CROSS-REFERENCE TO RELATED APPLICATIONS

This application is a U.S. national phase application filed under 35 U.S.C. § 371 of International Application No. PCT/JP2018/012846, filed Mar. 28, 2018, designating the United States, which claims priority from Japanese Patent Application No. 2017-066371, filed Mar. 29, 2017, which are hereby incorporated herein by reference in their entirety.

TECHNICAL FIELD

The present invention relates to a prepreg for a coreless substrate, a coreless substrate using the prepreg, a method of manufacturing the coreless substrate, and a semiconductor package.

BACKGROUND ART

With recent miniaturization and high performance of electronic devices, printed wiring boards are required to have higher wiring density and higher integration and to have a thinner board.

As a package structure based on these requirements, for example, Patent Literature 1 and Patent Literature 2 propose a coreless substrate which does not have a core substrate and mainly includes a build-up layer capable of high-density wiring. The coreless substrate is obtained by forming a build-up layer on a support (core substrate) such as a metal plate and then removing the support (core substrate), that is, in this case, only the build-up layer. As the build-up layer used for forming the coreless substrate, a prepreg obtained by impregnating a glass cloth with a resin composition, an insulating resin containing no glass cloth, or the like is used.

Since the rigidity of the coreless substrate is lowered due to thinning caused by removing the support (core substrate), the case that the semiconductor package warps when the semiconductor element is mounted and packaged becomes more conspicuous. The warpage is considered to be one of the factors that cause connection failure between the semiconductor element and the printed wiring board, and in the coreless substrate, a more effective reduction of the warpage is demanded.

One of the factors that warp the semiconductor package is the difference in the coefficient of thermal expansion between the semiconductor element and the printed wiring board. Generally, since the coefficient of thermal expansion of the printed wiring board is larger than the coefficient of thermal expansion of the semiconductor element, stress is generated by the thermal history or the like applied at the time of mounting the semiconductor element, and warpage occurs. Therefore, in order to suppress warpage of the semiconductor package, it is necessary to reduce the coefficient of thermal expansion of the printed wiring board to reduce the difference from the coefficient of thermal expansion of the semiconductor element, which is also applicable to the coreless substrate. Therefore, the build-up layer used for the coreless substrate is required to have a low thermal expansion coefficient.

Patent Literature 3 discloses a method of laminating an insulating resin containing no glass cloth as an insulating layer on both sides of a prepreg, but this method tends to increase warpage because the coefficient of thermal expansion increases.

Here, it is generally known that the coefficient of thermal expansion of a prepreg obtained by impregnating a glass cloth with a resin composition follows the Scapery Equation represented by the following formula.

$$A \approx (A_r E_r F_r + A_g E_g F_g)/(E_r F_r + E_g F_g)$$

(In the formula, A represents a coefficient of thermal expansion of the prepreg, $A_r$ represents a coefficient of thermal expansion of the resin composition, $E_r$ represents an elastic modulus of the resin composition, $F_r$ represents a volume fraction of the resin composition, $A_g$ represents a coefficient of thermal expansion of the glass cloth, $E_g$ represents an elastic modulus of the glass cloth, and $F_g$ represents a volume fraction of the glass cloth.)

From the above Scapery Equation, it can be seen that when a glass cloth having the same physical property is used at a given volume fraction, the low thermal expansion of the prepreg can be achieved by reducing the elastic modulus and the coefficient of thermal expansion of the resin composition.

For example, Patent Literature 4 discloses a prepreg formed of a resin composition containing a specific low elasticity component and a woven fabric base material as a prepreg capable of reducing warpage of a semiconductor package.

CITATION LIST

Patent Literature

Japanese Patent Application Laid-Open No. 2005-72085
Japanese Patent Application Laid-Open No. 2002-26171
Japanese Patent Application Laid-Open No. 2009-231222
Japanese Patent Application Laid-Open No. 2015-189834

SUMMARY OF INVENTION

Technical Problem

However, in the prepreg in which the elastic modulus of the resin composition is reduced as shown in Patent Literature 4, the influence of the load applied to the build-up layer due to the decrease in rigidity is large, and for example, the metal circuit may peel off in the via hole forming step by a laser or the like after the build-up layer is formed. Therefore, improvement of the bonding strength with the metal circuit is required.

In view of these circumstances, an object of the present invention is to provide a prepreg for a coreless substrate capable of satisfying the low thermal expansion, bonding strength with a metal circuit, heat resistance, and desmear resistance required for a coreless substrate, and a coreless substrate using the prepreg, a method for manufacturing the coreless substrate, and a semiconductor package.

Solution to Problem

As a result of extensive research to achieve the above-mentioned object, the present inventors have found that a prepreg including a thermosetting resin composition containing a (meth)acrylic elastomer and a specific thermosetting resin meets the above-mentioned object and have reached the present invention.

That is, the present invention provides the following [1] to [9].

[1] A prepreg for a coreless substrate including a thermosetting resin composition containing (a) (meth)acrylic elastomer, (b) an amine compound having at least two primary amino groups, and (c) a maleimide compound having at least two N-substituted maleimide groups.

[2] The prepreg for a coreless substrate according to the above [1], wherein the content of (meth)acrylic elastomer (a) is 1 to 60 parts by mass with respect to 100 parts by mass of a solid content of the resin component in the thermosetting resin composition.

[3] The prepreg for a coreless substrate according to the above [1] or [2], wherein the (meth)acrylic elastomer (a) has one or more reactive functional groups selected from the group consisting of an epoxy group, a hydroxy group, a carboxy group, an amino group, and an amide group.

[4] The coreless substrate prepreg according to any one of the above [1] to [3], wherein the thermosetting resin composition further contains (d) a thermosetting resin.

[5] The coreless substrate prepreg according to any one of the above [1] to [4], wherein the thermosetting resin composition further contains (e) a curing accelerator.

[6] The coreless substrate prepreg according to any one of the above [1] to [5], wherein the thermosetting resin composition further contains (f) an inorganic filler.

[7] A coreless substrate including an insulating layer formed using the coreless substrate prepreg according to any one of the above [1] to [6].

[8] A semiconductor package including a semiconductor element mounted on the coreless substrate according to the above [7].

[9] A method of manufacturing a coreless substrate that separates a build-up layer from a support after forming the build-up layer on the support,
wherein the build-up is formed by alternately stacking insulating layers and conductive layers, and
at least one layer of the insulating layers is formed using the coreless substrate prepreg according to any one of the above[1] to [6].

Advantageous Effects of Invention

According to the present invention, it is possible to provide a prepreg for a coreless substrate capable of satisfying the low thermal expansion, bonding strength with a metal circuit, heat resistance, and desmear resistance required for a coreless substrate, and a coreless substrate using the prepreg, a method for manufacturing the coreless substrate, and a semiconductor package.

BRIEF DESCRIPTION OF DRAWINGS

FIG. 1 is a schematic view showing one embodiment of the method for manufacturing a coreless substrate of the present invention.

DESCRIPTION OF EMBODIMENTS

In the numerical range described herein, the upper or lower limit of the numerical range may be replaced by the values shown in the embodiments. The lower limit value and the upper limit value of the numerical range are arbitrarily combined with the lower limit value and the upper limit value of the other numerical range, respectively.

Each of the components and materials exemplified in this specification may be used alone or in combination of two or more kinds unless otherwise specified. In the present specification, the content of each component in the composition means the total amount of a plurality of substances present in the composition when a plurality of substances corresponding to each component are present in the composition, unless otherwise specified.

Embodiments of any combination of the matters described in this specification are also included in the present invention.

[Prepreg for Coreless Substrate]

The coreless substrate prepreg of the present invention (hereinafter, also referred to simply as "prepreg") is a coreless substrate prepreg including a thermosetting resin composition containing (a) (meth)acrylic elastomer (hereinafter, also referred to as "component (a)), (b) an amine compound having at least two primary amino groups (hereinafter, also referred to simply as "amine compound (b)" or "component (b)), and (c) a maleimide compound having at least two N-substituted maleimide groups (hereinafter, also referred to simply as "maleimide compound (c)" or "component (c)).

Since the prepreg of the present invention is excellent in low thermal expansion and bonding strength with a metal circuit while maintaining excellent heat resistance and desmear resistance, it is particularly suitable for applications such as an insulating layer of a coreless substrate, which have excellent heat resistance and bonding strength with a metal circuit, and which require improvement of warpage due to thinning.

Hereinafter, each component contained in the thermosetting resin composition used for manufacturing the prepreg of the present invention will be described in order.

<(a) (Meth)Acrylic Elastomer>

The prepreg of the present invention comprises (a) a thermosetting resin composition containing (meth)acrylic elastomer, whereby the elastic modulus can be reduced while maintaining good adhesion strength with the metal circuit. The reason for this is not clear, but it is considered that the flexible acrylic skeleton possessed by the component (a) and the maleimide skeleton possessed by the component (c) with strong adhesive form a sea-island structure in an appropriate form and can exhibit their respective characteristics without bias.

The (meth)acrylic elastomer (a) is a polymer containing at least a structural unit derived from (meth)acrylic acid ester. The structural unit derived from (meth)acrylic acid ester means a structural unit formed when the vinyl bond of (meth)acrylic acid ester is added and polymerized. In this specification, "(meth)acrylic acid" means one or more selected from the group consisting of acrylic acid and methacrylic acid.

The (meth)acrylic elastomer (a) may be used alone or in combination of two or more kinds.

Examples of (meth)acrylate esters include, but are not limited to, (meth)methyl acrylate, (meth)ethyl acrylate, (meth)propyl acrylate, (meth)isopropyl acrylate, (meth)butyl acrylate, (meth)isobutyl acrylate, (meth)t-butyl acrylate, (meth)pentyl acrylate, (meth)hexyl acrylate, (meth)cyclohexyl acrylate, (meth)octyl acrylate, (meth)decyl acrylate, (meth)lauryl acrylate, (meth)benzyl acrylate, and the like.

The (meth)acrylic elastomer (a) may contain structural units derived from two or more (meth)acrylic acid esters or may contain structural units derived from two or more (meth)acrylic acid esters.

The (meth)acrylic elastomer (a) may contain a structural unit derived from a monomer other than the (meth)acrylic acid ester.

Examples of monomers other than (meth)acrylic ester include vinyl monomers such as acrylonitrile, (meth)acrylamide, (meth)acrylic acid, styrene, ethylene, propylene, butadiene, and the like. The (meth)acrylic elastomer (a) may contain structural units derived from monomers other than two or more (meth)acrylic esters.

The (meth)acrylic elastomer (a) may further have a reactive functional group at least one of a molecular end and a molecular chain. Examples of the reactive functional group include an epoxy group, a hydroxy group, a carboxy group, an amino group, an amide group, an isocyanato group, a (meth)acrylic group, and a vinyl group. By having these reactive functional groups, compatibility with other resin components is improved, and the internal stress generated at the time of curing of the thermosetting resin composition can be more effectively reduced, and as a result, warpage of the board can be remarkably reduced. In particular, from the viewpoint of low thermal expansion and bonding strength with the metal circuit, it is preferable to have one or more selected from the group consisting of an epoxy group, a hydroxy group, a carboxy group, an amino group, and an amide group, and from the standpoint of heat resistance and insulation reliability, it is more preferable to have one or more selected from the group consisting of epoxy group, hydroxy group and amide group.

In the case of having an epoxy group as the reactive functional group, the functional group equivalent weight is preferably 0.01 to 0.5 eq/kg, more preferably 0.03 to 0.4 eq/kg, and still more preferably 0.05 to 0.3 eq/kg.

In the case of having a hydroxy group as the reactive functional group, the hydroxyl value is preferably 5 to 100 mgKOH/g, more preferably 10 to 50 mgKOH/g, and still more preferably 15 to 30 mgKOH/g.

The weight average molecular weight (Mw) of the (meth)acrylic elastomer (a) is not particularly limited, but is preferably 1,000 to 2,000,000, more preferably 10,000 to 1,500,000, more preferably 100,000 to 1,400,000, and particularly preferably 300,000 to 1,300,000. When the weight average molecular weight (Mw) is equal to or more than the lower limit value, it tends to be superior in low elastic modulus, and when it is equal to or less than the upper limit value, it tends to be superior in compatibility and fluidity. The weight average molecular weight (Mw) was measured by gel permeation chromatography (GPC) and converted to a standard curve prepared using standard polystyrene.

The content of (meth)acrylic elastomer (a) is, from the standpoint of having excellent compatibility with other resin components and effectively reducing the elastic modulus of the cured product, preferably 1 to 60 parts by mass, more preferably 5 to 50 parts by mass, and still more preferably 10 to 30 parts by mass with respect to 100 parts by mass of the solid content of the resin component in the thermosetting resin composition. When the content of the (meth)acrylic elastomer (a) is within the above range, the sea-island structure can be formed in an appropriate form in the cured product, and the reduction of the elastic modulus due to the flexible (meth)acrylic elastomer (a) and the bonding strength of the maleimide compound (c) with the excellent metal circuit can be highly compatible.

Here, the solid content in the present embodiment means a component in the composition other than a volatile substance such as moisture, a solvent to be described later, or the like. That is, the solid content includes liquid, candy or wax at room temperature around 25° C., and does not necessarily mean solid.

<(b) Amine Compound Having at Least Two Primary Amino Groups>

The amine compound (b) is not particularly limited as long as it is an amine compound having at least two primary amino groups.

As the amine compound (b), an amine compound having two primary amino groups is preferable, and a diamine compound represented by the following general formula (b-1) is more preferable.

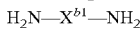

$$H_2N-X^{b1}-NH_2 \quad (b-1)$$

(In the general formula (b-1), $X^{b1}$ represents a group represented by the following general formula (b1-1), (b1-2), or (b1-3):

(b1-1)

(In the general formula (b1-1), $R^{b1}$ independently an aliphatic hydrocarbon group having 1 to 5 carbon atoms or a halogen atom; and p is an integer of 0 to 4.)

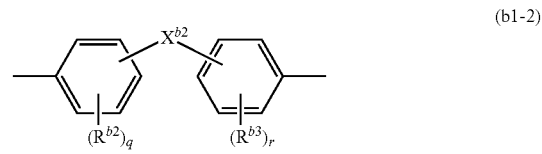

(b1-2)

(In the general formula (b1-2), $R^{b2}$ and $R^{b3}$ are each independently an aliphatic hydrocarbon group having 1 to 5 carbon atoms or a halogen atom; $X^{b2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (b1-2-1); and q and r are each independently an integer of 0 to 4.)

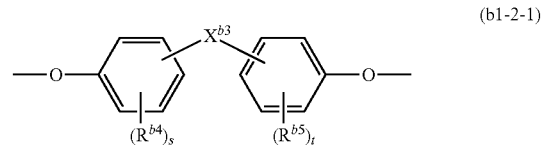

(b1-2-1)

(In the general formula (b1-2-1), $R^{b4}$ and $R^{b5}$ each independently represents an aliphatic hydrocarbon group having 1 to 5 carbon atoms or a halogen atom; $X^{b3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; and s and t are each independently an integer of 0 to 4.)

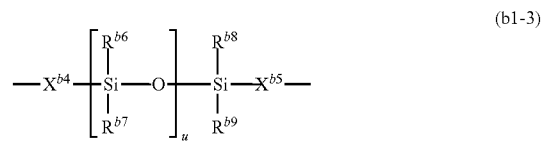

(b1-3)

(In the general formula (b1-3), $R^{b6}$, $R^{b7}$, $R^{b8}$ and $R^{b9}$ each independently represent an alkyl group, a phenyl group, or a substituted phenyl group having 1 to 5 carbon atoms; $X^{b4}$ and $X^{b5}$ each independently represent a divalent organic group; and u is an integer of 2 to 100.)

In the general formula (b1-1), examples of the aliphatic carbon group represented by $R^{b1}$ include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, more preferably a methyl group. Also, examples of the halogen atom include fluorine atom, chlorine atom, bromine atom, iodine atom, and the like.

Among the above, an aliphatic hydrocarbon group having 1 to 5 carbon atoms is preferable as the $R^{b1}$.

p is an integer of 0 to 4, and is preferably an integer of 0 to 2, more preferably 2, from the viewpoint of availability. When p is an integer of 2 or more, a plurality of R" may be the same or different from each other.

The aliphatic hydrocarbon group having 1 to 5 carbon atoms and the halogen atom represented by $R^{b2}$ and $R^{b3}$ in the general formula (b1-2) may be the same as those of the above $R^{b1}$. The aliphatic hydrocarbon group is preferably an aliphatic hydrocarbon group having 1 to 3 carbon atoms, more preferably a methyl group and an ethyl group, and more preferably an ethyl group.

Examples of the alkylene group having 1 to 5 carbon atoms represented by $X^{b2}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms from the viewpoint of heat resistance and low thermal expansion, and more preferably a methylene group.

Examples of the alkylidene group having 2 to 5 carbon atoms represented by $X^{b2}$ include an ethylidene group, a propylidene group, an isopropylidene group, a butylidene group, an isobutylidene group, a pentylidene group, an isopentylidene group, and the like. Among these, an isopropylidene group is preferable from the viewpoints of heat resistance and low thermal expansion.

Among the above-mentioned options, an alkylene group having 1 to 5 carbon atoms and an alkylidene group having 2 to 5 carbon atoms are preferable as the $X^{b2}$. More preferable are as described above.

Each of q and r is independently an integer of 0 to 4, and from the viewpoint of availability, each is preferably an integer of 0 to 2, more preferably 0 or 2. When q or r is an integer of 2 or more, a plurality of $R^{b2}$ or $R^{b3}$ may be the same or different from each other.

The aliphatic hydrocarbon group having 1 to 5 carbon atoms and the halogen atom represented by $R^{b4}$ and $R^{b5}$ in the general formula (b1-2-1) include the same as those of the $R^{b2}$ and the $R^{b3}$, and the preferred group is the same as preferred those of the $R^{b2}$ and $R^{b3}$.

The alkylene group having 1 to 5 carbon atoms and the alkylidene group having 2 to 5 carbon atoms represented by $X^{b3}$ include the same as the alkylene group having 1 to 5 carbon atoms and the alkylidene group having 2 to 5 carbon atoms represented by $X^{b2}$, and the preferred group is the same as preferred those of the $X^{b2}$.

Among the above options, $X^{b3}$ is preferably an alkylidene group having 2 to 5 carbons, and more preferable alkylidene groups are as described above.

The s and t are integers of 0 to 4, and from the viewpoint of availability, both are preferably integers of 0 to 2, more preferably 0 or 1, and even more preferably 0. When s or t is an integer of 2 or more, a plurality of $R^{b4}$ or $R^{b5}$ may be the same or different from each other.

The general formula (b1-2-1) is preferably represented by the following general formula (b1-2-1').

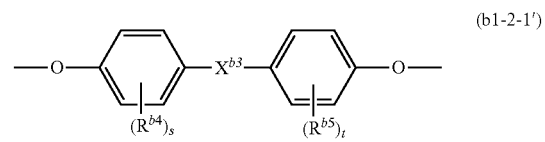

(b1-2-1')

($X^{b3}$, $R^{b4}$, $R^{b5}$, s and t in the general formula (b1-2-1') are the same as those in the general formula (b1-2-1), and the preferred ones are the same.)

The group represented by the general formula (b1-2) is preferable a group represented by the following general formula (b1-2'), more preferably a group represented by any one of the following general formulae (b1-i) to (b1-iii), and more preferably a group represented by the following general formula (b1-ii) or (b1-iii).

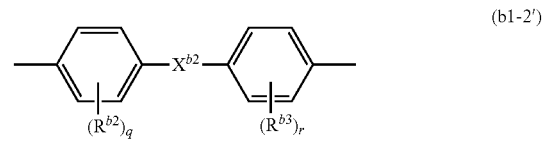

(b1-2')

($X^{b2}$, $R^{b2}$, $R^{b3}$, q and r in the general formula (b1-2') are the same as those in the general formula (b1-2), and the preferred ones are the same.)

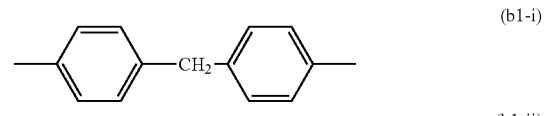

(b1-i)

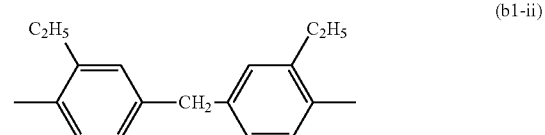

(b1-ii)

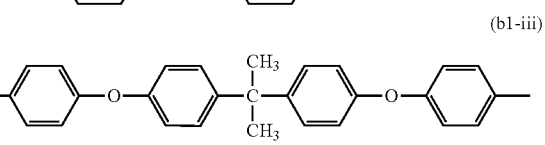

(b1-iii)

Examples of the alkyl group having 1 to 5 carbons represented by $R^{b6}$, $R^{b7}$, $R^{b8}$, and $R^{b9}$ in the general formula (b1-3) include a methyl group, an ethyl group, a n-propyl group, an isopropyl group, a n-butyl group, an isobutyl group, a t-butyl group, a n-pentyl group, and the like. As the alkyl group, an alkyl group having 1 to 3 carbon atoms is preferable, and a methyl group is more preferable.

Examples of the substituent of the phenyl group in the substituted phenyl group include an alkyl group having 1 to 5 carbon atoms, an alkenyl group having 2 to 5 carbon atoms, an alkynyl group having 2 to 5 carbon atoms, and the like. Examples of the alkyl group having 1 to 5 carbon atoms include the same alkyl groups as those described above. Examples of the alkenyl group having 2 to 5 carbon atoms include a vinyl group, an allyl group, and the like. Examples of the alkynyl group having 2 to 5 carbon atoms include an ethynyl group, a propargyl group, and the like.

Both $R^{b6}$, $R^{b7}$, $R^{b8}$ and $R^{b9}$ are preferably alkyl groups having 1 to 5 carbons, and more preferably methyl groups.

Examples of divalent organic groups represented by $X^{b4}$ and $X^{b5}$ include an alkylene group, an alkenylene group, an alkynylene group, an arylene group, and —O— or a divalent linking group formed by combining these groups. Examples of the alkylene group include an alkylene group having 1 to 10 carbon atoms such as a methylene group, an ethylene group, and a propylene group. Examples of the alkenylene group include an alkenylene group having 2 to 10 carbon atoms. Examples of the alkynylene group include an alkynylene group having 2 to 10 carbon atoms. Examples of the arylene group include an arylene group having 6 to 20 carbon atoms, such as a phenylene group or a naphthylene group.

In the general formula (b-1), the $X^{b1}$ may be any of the groups represented by the general formula (b1-1), (b1-2) or (b1-3), and among these, the group represented by the general formula (b1-3) is preferable from the viewpoint of low thermal expansion and bonding strength with metallic circuits.

Specific examples of the component (b) include diaminobenzidine, diaminodiphenylmethane, diaminodiphenyl ether, diaminodiphenyl sulfone, 3,3'-dichloro-4,4'-diaminobiphenyl, 3,3'-dimethoxy-4,4'-diaminobiphenyl, 3,3'-dimethyl-4,4'-diaminobiphenyl, 3,3'-dimethyl-4,4'-diaminobiphenyl-6,6'-disulfonic acid, 2,2',5,5'-tetrachloro-4,4'-diaminobiphenyl, 4,4'-methylen-bis(2-chloroaniline), 1,3'-bis(4-aminophenoxy)benzene, 2,2'-bis[4-(4-aminophenoxy)phenyl]propane, bis[4-(4-aminophenoxy)phenyl]sulfone, bis[4-(3-aminophenoxy)phenyl]sulfone, 4,4'-bis(4-aminophenoxy)biphenyl, 2,2'-bis[4-(4-aminophenoxy)phenyl]hexafluoropropane, 1,4'-bis(4-aminophenoxy)benzene, 4,4'-diaminodiphenyl sulfide, 2,2'-dimethyl-4,4'-diaminobiphenyl, 4,4'-diamino-3,3'-biphenyldiol, 9,9'-bis(4-aminophenyl)fluorene, o-tridinesulfone, a modified siloxane compound with a primary amino group at its molecular end. Among these, from the viewpoints of heat resistance, desmear resistance, low thermal expansion, and adhesion strength with a metal circuit, a modified siloxane compound having a primary amino group at its molecular end is preferable.

As the modified siloxane compound having a primary amino group at its molecular end, a modified siloxane compound having a primary amino group at both ends of the molecule (hereinafter, also referred to as "both-terminal diamine-modified siloxane") is preferable, and as the X" in the general formula (b-1), a compound having a group represented by the general formula (b1-3) is more preferable.

As both-terminal diamine-modified siloxanes, commercially available products may be used, and examples thereof include modified siloxane compounds having a primary amino group at both ends, such as "PAM-E" (functional group equivalent weight of amino group: 130 g/mol), "KF-8010" (functional group equivalent weight of amino group: 430 g/mol), "X-22-161A" (functional group equivalent weight of amino group: 800 g/mol), "X-22-161B" (functional group equivalent weight of amino group: 1,500 g/mol), "KF-8012" (functional group equivalent weight of amino group: 2,200 g/mol), and "KF-8008" (functional group equivalent weight of amino group: 5,700 g/mol) (all manufactured by Shin-Etsu Chemical Co., Ltd), "BY16-871" (functional group equivalent weight of amino group: 130 g/mol) and "BY16-853U" (functional group equivalent weight of amino group: 460 g/mol) (all manufactured by Toray Dow Corning Co. Ltd), and the like. Among them, "X-22-161A" and "X-22-161B" are preferable from the viewpoint of high reactivity and lower thermal expansion.

There is no particular limitation on the functional group equivalent weight of the amino group of the modified siloxane compound having a primary amino group at the molecular end, but 300 to 3,000 g/mol is preferable, 400 to 2,500 g/mol is more preferable, and 600 to 2,000 g/mol is further preferable.

The content of the component (b) is preferably 3 to 50 parts by mass, more preferably 5 to 30 parts by mass, and still more preferably 7 to 20 parts by mass with respect to 100 parts by mass of the solid content of the resin component in the thermosetting resin composition from the viewpoint of low thermal expansion and adhesion strength with the metal circuit.

<(c) Maleimide Compound Having at Least Two N-Substituted Maleimide Groups>

The maleimide compound (c) is not particularly limited as long as it is a maleimide compound having at least two N-substituted maleimide groups.

As the maleimide compound (c), a maleimide compound having two N-substituted maleimide groups is preferable, and a compound represented by the following general formula (c-1) is more preferable.

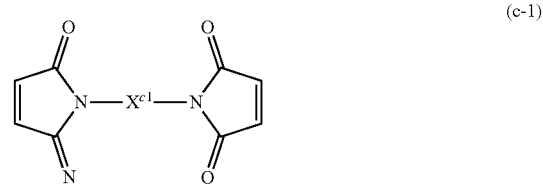

(c-1)

(In the general formula (c-1), $X^{c1}$ is a group represented by the following general formula (c1-1), (c1-2), (c1-3), or (c1-4):

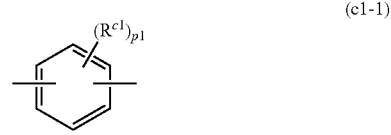

(c1-1)

(In the general formula (c1-1), $R^{c1}$ is independently an aliphatic hydrocarbon group having 1 to 5 carbon atoms or a halogen atom, and p1 is an integer of 0 to 4.)

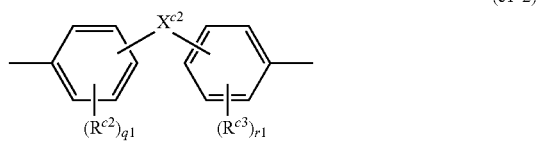

(c1-2)

(In the general formula (c1-2), $R^{c2}$ and $R^{c3}$ are each independently an aliphatic hydrocarbon group having 1 to 5 carbon atoms or a halogen atom; $X^{c2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (c1-2-1); q1 and r1 are each independently an integer of 0 to 4.)

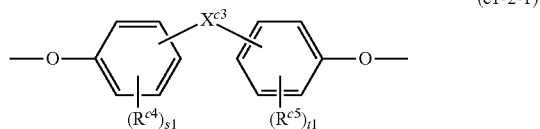

(In the general formula (c1-2-1), $R^{c4}$ and $R^{c5}$ are each independently an aliphatic hydrocarbon group having 1 to 5 carbon atoms or a halogen atom; $X^{c3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; s1 and t1 are each independently an integer of 0 to 4.)

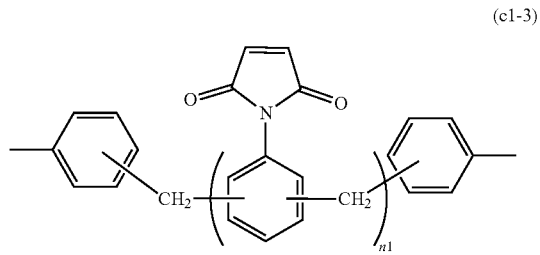

(In the general formula (c1-3), n1 is an integer of 1 to 10.)

(In the general formula (c1-4), $R^{c6}$ and $R^{c7}$ each independently represent a hydrogen atom or an aliphatic hydrocarbon group having 1 to 5 carbon atoms, and u1 is an integer of 1 to 8.)

In the general formula (c1-1), for example, the aliphatic carbon groups represented by $R^{c1}$ include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, more preferably a methyl group. Also, examples of the halogen atom include fluorine atom, chlorine atom, bromine atom, iodine atom, and the like.

Among the above, an aliphatic hydrocarbon group having 1 to 5 carbon atoms is preferable as the $R^{c1}$.

p1 is an integer of 0 to 4, and is preferably an integer of 0 to 2, more preferably 0 or 1, and even more preferably 0 from the viewpoint of availability. When p1 is an integer of 2 or more, a plurality of $R^{c1}$ may be the same or different from each other.

The aliphatic hydrocarbon group having 1 to 5 carbon atoms and the halogen atom represented by $R^{c2}$ and $R^{c3}$ in the above general formula (c1-2) may be the same as those of the above $R^{c1}$. The aliphatic hydrocarbon group is preferably an aliphatic hydrocarbon group having 1 to 3 carbon atoms, more preferably a methyl group and an ethyl group, and more preferably an ethyl group.

Examples of the alkylene group having 1 to 5 carbon atoms represented by $X^{c2}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms from the viewpoint of heat resistance and low thermal expansion, and more preferably a methylene group.

Examples of the alkylidene group having 2 to 5 carbons represented by $X^{c2}$ include an ethylidene group, a propylidene group, an isopropylidene group, a butylidene group, an isobutylidene group, a pentylidene group, an isopentylidene group, and the like. Among these, an isopropylidene group is preferable from the viewpoints of heat resistance and low thermal expansion.

Among the above-mentioned options, an alkylene group having 1 to 5 carbon atoms and an alkylidene group having 2 to 5 carbon atoms are preferable as the $X^{c2}$. More preferable are as described above.

Each of q1 and r1 is independently an integer of 0 to 4, and from the viewpoint of availability, any of q1 and r1 is preferably an integer of 0 to 2, more preferably 0 or 2. When q1 or r1 is an integer of 2 or more, a plurality of $R^{c2}$ or $R^{c3}$ may be the same or different from each other.

The aliphatic hydrocarbon group having 1 to 5 carbon atoms and the halogen atom represented by $R^{c4}$ and $R^{c5}$ in the general formula (c1-2-1) include the same as those of the $R^{c2}$ and the $R^{c3}$, and the preferred aliphatic hydrocarbon groups and preferred halogen atoms are also the same as preferred those of $R^{c2}$ and the $R^{c3}$.

As the alkylene group having 1 to 5 carbon atoms and the alkylidene group having 2 to 5 carbon atoms represented by $X^{c3}$, the same as the alkylene group having 1 to 5 carbon atoms and the same as the alkylidene group having 2 to 5 carbon atoms represented by $X^{c2}$ are mentioned, and the preferred alkylene groups and preferred alkylidene groups of $X^{c3}$ are also the same as preferred those of the $X^{c2}$.

Among the above options, $X^{c3}$ is preferably an alkylidene group having 2 to 5 carbons, and more preferable alkylidene groups are as described above.

The values s1 and t1 are integers of 0 to 4, and from the viewpoint of availability, both are preferably integers of 0 to 2, more preferably 0 or 1, and even more preferably 0. When s1 or t1 is an integer of 2 or more, a plurality of $R^{c4}$ or $R^{c5}$ may be the same or different from each other.

The general formula (c1-2-1) is preferably represented by the following general formula (c1-2-1').

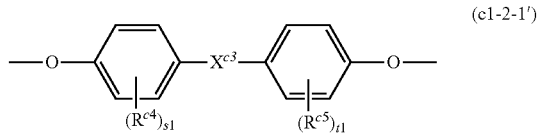

(In the general formula (c1-2-1'), $X^{c3}$, $R^{c4}$, $R^{c5}$, s1 and t1 are the same as those in the general formula (c1-2-1), and the preferred ones are the same.)

The group represented by the general formula (c1-2) is preferably a group represented by the general formula (c1-2'), more preferably a group represented by any one of the following general formulae (c1-i) to (c1-iii), and more preferably a group represented by the following (c1-i) or (c1-ii).

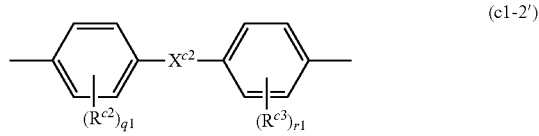

(c1-2')

($X^{c2}$, $R^{c2}$, $R^{c3}$, q1 and r1 in the general formula (c1-2') are the same as those in the general formula (c1-2), and the preferred ones are the same.)

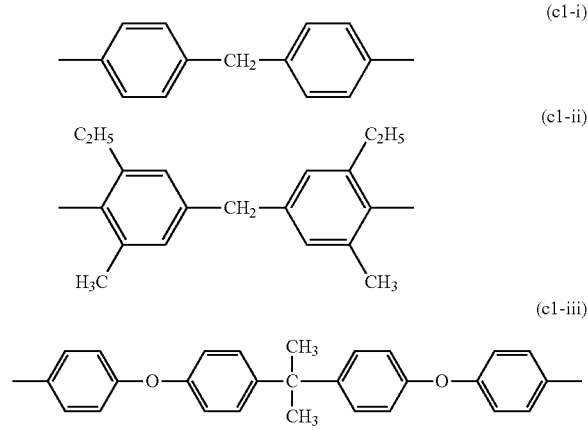

In the above general formula (c1-3), n1 is an integer of 1 to 10, and preferably an integer of 1 to 5, more preferably an integer of 1 to 3, from the viewpoint of availability.

The aliphatic hydrocarbon group having 1 to 5 carbon atoms represented by $R^{c6}$ and $R^{c7}$ in the above general formula (c1-4) may be the same as that represented by Rd in the above general formula (c1-1), and the aliphatic hydrocarbon group having 1 to 5 carbon atoms may be the same as that represented by $R^{c1}$ in the above general formula (c1-1). u1 is an integer of 1 to 8, preferably an integer of 1 to 3, more preferably 1.

In the general formula (c-1), $X^{c1}$ may be any one of the groups represented by the general formula (c1-1), (c1-2), (c1-3) or (c1-4), and among these, it is preferable to be a group represented by the general formula (c1-2) from the viewpoint of low thermal expansion and bending elastic modulus.

Specific examples of the component (c) include bis(4-maleimidophenyl)methane, polyphenylmethane maleimide, bis(4-maleimidophenyl)ether, bis(4-maleimidophenyl)sulfone, 3,3'-dimethyl-5,5'-diethyl-4,4'-diphenylmethane bismaleimide, 4-methyl-1,3-phenylenebismaleimide, m-phenylenebismaleimide, 2,2-bis[4-(4-maleimidophenoxy)phenyl]propane, and the like.

Among these, bis(4-maleimidophenyl)methane, bis(4-maleimidophenyl)sulfone, 3,3'-dimethyl-5,5'-diethyl-4,4'-diphenylmethane bismaleimide, 2,2-bis[4-(4-maleimidophenoxy)phenyl]propane are preferable from the viewpoint of high reactivity and high heat resistance, and 3,3'-dimethyl-5,5'-diethyl-4,4'-diphenylmethane bismaleimide, bis(4-maleimidophenyl)methane are more preferable from the standpoint of solubility in solvent, and bis(4-maleimidophenyl)methane is more preferable from the standpoint of manufacturing cost.

The content of the component (c) is preferably 20 to 90 parts by mass, more preferably 30 to 70 parts by mass, and still more preferably 40 to 60 parts by mass with respect to 100 parts by mass of the solid content of the resin component in the thermosetting resin composition from the viewpoint of elastic modulus and low thermal expansion.

The components (b) and (c) may be mixed with the component (a) or the like as they are, or the components (b) and (c) may be heated and reacted with each other to form an amino-modified polyimide resin (hereinafter referred to as an amino-modified polyimide resin (X)) in advance, if necessary, before mixing with the components (a). That is, the present invention also provides a prepreg for a coreless substrate including (a) a (meth)acrylate elastomer, and a thermosetting resin composition containing (X) an amino-modified polyimide resin which is a reactant of (b) an amine compound having at least two primary amino groups and (c) a maleimide compound having at least two N-substituted maleimide groups. When the component (b) and the component (c) are reacted in advance to form the amino-modified polyimide resin (X), the molecular weight can be controlled, and moreover, the low curing shrinkage property and the low thermal expansion property can be improved. The amino-modified polyimide resin (X) will be described below.

<(X) Amino-Modified Polyimide Resin>

There is no particular limitation on the reaction method of the component (c) with the component (b). The reaction temperature is preferably from 70 to 200° C., more preferably from 80 to 150° C., and more preferably from 100 to 130° C., from the viewpoint of productivity and sufficient reaction progress. The reaction time is not particularly limited, but 0.5 to 10 hours is preferable, and 1 to 6 hours is more preferable.

The reaction of the component (c) with the component (b) is preferably carried out in an organic solvent. Examples of the organic solvent include alcoholic solvents such as ethanol, propanol, butanol, methyl cellosolve, butyl cellosolve, propylene glycol monomethyl ether and the like; ketone solvents such as acetone, methyl ethyl ketone, methyl isobutyl ketone, cyclohexanone, and the like; ester solvents such as ethyl acetate, γ-butyrolactone, and the like; ether solvents such as tetrahydrofuran and the like; aromatic solvents such as toluene, xylene, mesitylene, and the like; nitrogen atom-containing solvents such as dimethylformamide, dimethylacetamide, N-methylpyrrolidone and the like; sulfur atom-containing solvents such as dimethyl sulfoxide and the like. These may be used alone or in combination of two or more kinds.

Among these, cyclohexanone, propylene glycol monomethyl ether, methyl cellosolve, γ-butyrolactone are preferable from the viewpoint of solubility, and cyclohexanone, propylene glycol monomethyl ether, dimethylacetamide are preferable and propylene glycol monomethyl ether is more preferable from the viewpoint of low toxicity and high volatility and difficulty in remaining as a residual solvent.

There is no particular limitation on the amount of the organic solvent used, but from the viewpoint of solubility and reaction rate, the amount thereof is preferably 25 to 1,000 parts by mass, more preferably 50 to 500 parts by mass, and still more preferably 50 to 200 parts by mass with respect to the total 100 parts by mass of the component (b) and the component (c).

After completion of the above reaction, the obtained reaction mixture can be mixed with other components as it is without purification of the reactants in particular to prepare a thermosetting resin composition containing an amino-modified polyimide resin (X).

In the reaction, from the viewpoint of prevention of gelation and heat resistance, the use ratio of the component (b) and the component (c) is preferably such that the equivalent weight of the maleimide group of the component (c) exceeds the equivalent weight of the primary amino group of the component (b), that is, the ratio [(c)/(b)] of the equivalent weight of the maleimide group of the component (c) to the equivalent weight of the primary amino group of the component (b) exceeds 1, more preferably from 2 to 35, and still more preferably from 10 to 35.

When the thermosetting resin composition contains an amino-modified polyimide resin (X), the content thereof is preferably 40 to 95 parts by mass, more preferably 50 to 80 parts by mass, and still more preferably 60 to 70 parts by mass with respect to 100 parts by mass of the solid content of the resin component in the thermosetting resin composition.

<(d) Thermosetting Resin>

The thermosetting resin composition may further contain, and preferably contains, a thermosetting resin (d). However, the thermosetting resin (d) does not contain the component (b) and the component (c). As the thermosetting resin (d), one type may be used alone or in combination of two or more kinds.

Examples of the thermosetting resins (d) include an epoxy resin, a phenolic resin, an unsaturated imide resin (excluding the component (c)), a cyanate resin, an isocyanate resin, a benzoxazine resin, an oxetane resin, and an amino resin (excluding the component (b)), an unsaturated polyester resin, an allyl resin, a dicyclopentadiene resin, a silicone resin, a triazine resin, and a melamine resin (excluding the component (b)). Among these, one or more selected from the group consisting of an epoxy resin and a cyanate resin is preferable from the viewpoints of moldability and electrical insulating properties, and bonding strength with a metal circuit, and an epoxy resin is more preferable.

Examples of the epoxy resin include a bisphenol A type epoxy resin, a bisphenol F type epoxy resin, a bisphenol S type epoxy resin, a phenol novolac type epoxy resin, a cresol novolac type epoxy resin, an α-naphthol/cresol novolac type epoxy resin, a bisphenol A novolac type epoxy resin, a bisphenol F novolac type epoxy resin, a stilbene type epoxy resin, an epoxy resin containing a triazine skeleton, an epoxy resin containing a fluorene skeleton, a triphenol type epoxy resin, a biphenyl type epoxy resin, a xylene type epoxy resin, a biphenyl aralkyl type epoxy resin, a naphthalene type epoxy resin, a dicyclopentadiene type epoxy resins, a cycloaliphatic epoxy resins, a polyfunctional phenol, a polycyclic aromatic diglycidyl ether compound such as anthracene, and a phosphorus-containing epoxy resin thereof into which a phosphorus compound are introduced. These may be used alone or in combination of two or more kinds. Among these, a biphenylalalkyl type epoxy resin and an α-naphthol/cresol novolac type epoxy resin are preferable from the viewpoints of heat resistance and flame retardancy.

When the thermosetting resin composition contains a thermosetting resin (d), the content thereof is preferably 1 to 30 parts by mass, more preferably 5 to 25 parts by mass, and still more preferably 10 to 20 parts by mass with respect to 100 parts by mass of the solid content of the resin component in the thermosetting resin composition.

<(e) Curing Accelerator>

The thermosetting resin composition may further contain (e) a curing accelerator.

Examples of the curing accelerator (e) include organometallic salts such as zinc naphthenate, cobalt naphthenate, tin octylate, cobalt octylate, bis-acetylacetonate cobalt (II), tris-acetylacetonate cobalt (III), imidazoles and derivatives thereof; organophosphorus compounds; secondary amines; tertiary amines; quaternary ammonium salts, and the like. These may be used alone or as a mixture of two or more kinds thereof. Among these, imidazoles and derivatives thereof are preferable from the viewpoints of heat resistance, flame retardancy, and adhesion strength with a metal circuit, and organophosphorus compounds are preferable from the viewpoint of low thermal expansion.

A commercial product may be used as the curing accelerator (e). Commercially available products include isocyanate mask imidazole (manufactured by Daiichi Kogyo Pharmaceutical Co., Ltd., trade name: G-8009L), triphenylphosphine triphenylborane (manufactured by Hokko Chemical Industry Co., Ltd., trade name: TPP-S), and the like.

When the thermosetting resin composition contains the curing accelerator (e), the content thereof is preferably 0.1 to 10 parts by mass, more preferably 0.3 to 5 parts by mass, and still more preferably 0.5 to 2 parts by mass with respect to 100 parts by mass of the solid content of the resin component in the thermosetting resin composition. When the content of the curing accelerator (e) is 0.1 parts by mass or more, it tends to be excellent in heat resistance, flame retardancy, and copper foil adhesion, and when it is 10 parts by mass or less, it tends to be excellent in heat resistance, day-lapse stability, and press formability.

<(f) Inorganic Filler>

The thermosetting resin composition may further contain (f) an inorganic filler.

Examples of the inorganic filler (f) include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as fired clay and the like, talc, aluminum borate, silicon carbide, quartz powder, short glass fiber, glass fine powder, hollow glass, and the like. Examples of the glass include E glass, T glass, and D glass. These may be used alone or in combination of two or more kinds.

Among these, silica is preferable from the viewpoints of dielectric properties, heat resistance, and low thermal expansion. Examples of the silica include precipitated silica produced by a wet process and having a high moisture content, and dry-process silica produced by a dry process and containing almost no bound water and the like, and the dry-process silica is further classified into crushed silica, fumed silica, fused spherical silica and the like depending on the difference in the manufacture method. Among these, molten spherical silica is preferable from the viewpoint of low thermal expansion and fluidity when filled in a resin.

The average particle diameter of the inorganic filler (f) is preferably 0.1 to 10 μm, more preferably 0.3 to 8 μm, and still more preferably 0.3 to 3 μm. When the average particle diameter is 0.1 μm or more, the fluidity at the time of highly filling the resin tends to be kept good, and when the average particle diameter is 10 μm or less, the mixing probability of coarse particles is reduced and the occurrence of defects caused by coarse particles tends to be suppressed. Here, the average particle diameter is a particle diameter at a point corresponding to a volume of 50% when the cumulative frequency distribution curve according to the particle diameter is obtained by setting the total volume of the particles to 100%, and can be measured by a particle size distribution measuring apparatus using a laser diffraction scattering method or the like.

The inorganic filler (f) may be surface treated with a coupling agent. The method of surface treatment by the coupling agent may be a method of surface treatment by a dry method or a wet method with respect to the inorganic filler (f) before blending, or a so-called integral blend treatment method in which a silane coupling agent is added to the composition after the surface untreated inorganic filler (f) is blended into another component to form a composition.

Examples of the coupling agent include a silane-based coupling agent, a titanate-based coupling agent, and a silicone oligomer.

When the thermosetting resin composition contains the inorganic filler (f), the content thereof is preferably 10 to 300 parts by mass, more preferably 50 to 250 parts by mass, and still more preferably 70 to 180 parts by mass with respect to 100 parts by mass of the solid content of the resin component in the thermosetting resin composition. When the content of the inorganic filler (f) is within the above range, the moldability and the low thermal expansion are favorable.

When the thermosetting resin composition contains the inorganic filler (f), it is preferable to improve the dispersibility of the inorganic filler (f) by performing a treatment with a disperser such as a three-roll, a bead mill, or a nano-mixer, if necessary.

<Other Components>

The thermosetting resin composition contained in the prepreg of the present invention may contain other components such as a flame retardant, an ultraviolet absorber, an antioxidant, a photopolymerization initiator, a fluorescent brightener, an adhesion improving agent, and the like to the extent that the thermosetting property is not impaired.

Examples of the flame retardant include a phosphorus flame retardant such as an aromatic phosphate ester compound, a phosphazene compound, a phosphinic acid ester, a metal salt of phosphinic acid compound, red phosphorus, 9,10-dihydro-9-oxa-10-phosphaphenanthrene-10-oxide, and a derivative thereof; a nitrogen flame retardant such as guanidine sulfamate, melamine sulfate, melamine polyphosphate, melamine cyanurate; a halogen-containing flame retardant containing bromine, chlorine, and the like; and an inorganic flame retardant such as antimony trioxide.

Examples of the ultraviolet absorber include a benzotriazole-based ultraviolet absorber.

Examples of the antioxidant include a hindered phenol antioxidant, a hindered amine antioxidant, and the like.

Examples of the photopolymerization initiator include benzophenone, benzylketals, thioxanthones, and the like.

Examples of the fluorescent whitening agent include a fluorescent whitening agent of a stilbene derivative.

Examples of the adhesion improving agent include urea compounds such as urea silane, and the coupling agent.

The thermosetting resin composition may be in the form of a varnish in which each component is dissolved or dispersed in an organic solvent so as to be easily used for manufacturing a prepreg or the like.

Examples of the organic solvent include an alcohol-based solvent such as methanol, ethanol, propanol, butanol, methyl cellosolve, butyl cellosolve, propylene glycol monomethyl ether, and the like; a ketone-based solvent such as acetone, methyl ethyl ketone, methyl isobutyl ketone, cyclohexanone, and the like; an ester-based solvent such as butyl acetate, propylene glycol monomethyl ether acetate, and the like; an ether-based solvent such as tetrahydrofuran and the like; an aromatic solvent such as toluene, xylene, mesitylene, and the like; a nitrogen atom-containing solvent such as dimethylformamide, dimethylacetamide, N-methylpyrrolidone, and the like; and a sulfur atom-containing solvent such as dimethyl sulfoxide and the like. These organic solvents may be used alone or in combination of two or more kinds.

Among these, methyl ethyl ketone, methyl isobutyl ketone, cyclohexanone, methyl cellosolve, and propylene glycol monomethyl ether are preferable from the viewpoint of solubility of each component, methyl ethyl ketone is more preferable, and methyl isobutyl ketone, cyclohexanone, and propylene glycol monomethyl ether are more preferable from the viewpoint of low toxicity.

The solid content concentration of the varnish is preferably 40 to 90% by mass, more preferably 50 to 80% by mass. When the solid content concentration of the varnish is within the above-mentioned range, the coating property can be kept good, and a prepreg having an appropriate adhesion amount of the thermosetting resin composition can be obtained.

The flexural modulus of the prepreg of the present invention is preferably 25 GPa or less, more preferably 20 GPa or less, and still more preferably 18 GPa or less from the viewpoint of warpage reduction. The lower limit of the flexural modulus is, for example, 5 GPa or more, and may be 10 GPa or more.

The flexural modulus can be measured by the method shown in the embodiments.

The prepreg of the present invention can be manufactured, for example, by impregnating the thermosetting resin composition into a fiber base material and semi-curing (B-staging) by heating or the like.

As the fiber base material, well-known materials used for various laminates for electrically insulating materials can be used. Examples of the material include inorganic fibers such as E glass, S glass, low dielectric glass, and Q glass; organic fibers such as low dielectric glass polyimide, polyester, and tetrafluoroethylene; and mixtures thereof. In particular, from the viewpoint of obtaining a base material having excellent dielectric properties, inorganic fibers are preferable, and low dielectric glass and Q glass are more preferable.

The fiber base material has, for example, a shape of woven fabric, nonwoven fabric, roving, chopped strand mat, surfacing mat, and the like.

The material and shape of the fiber base material are appropriately selected depending on the object use and performance of the molded article, and may be a fiber base material of one kind of material and one kind of shape, a fiber base material of two or more kinds, or a fiber base material having two or more kinds of shapes, as necessary. The fiber base material may be, for example, about 0.03 to 0.5 mm thick. From the viewpoints of heat resistance, moisture resistance, processability, and the like, it is preferable that the fiber base material is surface-treated with a silane coupling agent or the like, and are mechanically subjected to a fiber opening treatment.

In the prepreg of the present invention, for example, it is preferable that the amount of adhering the solid content of the thermosetting resin composition to the fiber base material is 20 to 90% by mass in terms of the content of the thermosetting resin composition to the prepreg after drying.

The prepreg of the present invention can be manufactured, for example, by impregnating a thermosetting resin composition into a fiber base material so that the amount of solid content adhered of the thermosetting resin composition in the prepreg falls within the above range, followed by heating and drying at a temperature of 100 to 200° C. for 1 to 30 minutes, and semi-curing (B-staging).

By using the prepreg of the present invention, a laminate containing an insulating layer can be obtained. The laminate can be manufactured by laminating and molding the prepreg of the present invention. Specifically, the prepreg of the present invention can be manufactured by preparing one sheet or two to twenty sheets of the prepreg, and laminating and forming the prepreg in a configuration in which a metal foil of copper, aluminum, or the like is disposed on one side or both sides of the prepreg as necessary. The metal foil is not particularly limited as long as it is used for an electrical insulating material.

As molding conditions for manufacturing the stack, for example, a laminate for an electrically insulating material and a method of a multilayer plate can be applied, and molding can be performed at a temperature of 100 to 250° C., a pressure of 0.2 to 10 MPa, and a heating time of 0.1 to 5 hours using a multistage press, a multistage vacuum press, a continuous molding, an autoclave molding machine, or the like. In addition, the prepreg of the present invention and the wiring board for the inner layer may be combined and formed in a stack manner to produce a laminated board.

Further, a printed wiring board can be manufactured by performing circuit processing on the metal foil.

[Coreless Substrate and Method of Manufacturing the Coreless Substrate]

The coreless substrate of the present invention contains an insulating layer formed using the prepreg for coreless substrate of the present invention.

The coreless substrate of the present invention can be manufactured by, for example, a method of forming a build-up layer on a support (core substrate) using the prepreg of the present invention, and then separating the support. The method of forming the build-up layer is not particularly limited, and a known method can be employed. For example, the build-up layer can be formed by the following method (see FIG. 1).

First, the prepreg 2 of the present invention is disposed on a support (core substrate) 1. The prepreg 2 may be disposed on the support (core substrate) 1 after disposing an adhesive layer. Thereafter, the prepreg 2 is heated and cured to form an insulating layer. Next, after the via hole 3 is formed by a drilling method, a laser processing method using a YAG laser, a $CO_2$ laser, or the like, a surface roughening treatment and a desmear treatment are performed as required. Subsequently, the circuit pattern 4 is formed by a subtractive method, a full additive method, a semi-additive method (SAP: Semi Additive Process), a modified semi-additive method (m-SAP: modified Semi Additive Process), or the like. By repeating the above process, the build-up layer 5 is formed. A coreless substrate is obtained by separating the formed build-up layer 5 from the support (core substrate) 1. The build-up layer 5 may be formed on one surface of the support body (core substrate) 1 or may be formed on both surfaces of the support body (core substrate) 1.

The coreless substrate of the present invention includes one or more insulating layers obtained by curing the prepreg of the present invention, and may include insulating layers obtained by curing a prepreg, a resin film, or the like other than the prepreg of the present invention.

The coreless substrate of the present invention has a small thickness because it does not have a core substrate, and in particular, it usually has a thickness of preferably 15 to 200 mm, more preferably 30 to 150 mm, and more preferably 35 to 100 mm.

[Semiconductor Packaging]

The semiconductor package of the present invention is formed by mounting a semiconductor element on a coreless substrate of the present invention, and is manufactured by mounting a semiconductor element such as a semiconductor chip or a memory at a predetermined position on the coreless substrate.

EXAMPLES

The present invention will now be described in more detail by the following examples, which are not intended to limit the invention.

The performance of the copper clad laminate obtained in the following examples was measured and evaluated by the following method.

(1) Thermal Expansion Ratio

By removing the copper foil by immersing the copper clad laminate in a copper etchant, an evaluation substrate having a length (X direction) of 5 mm×a width (Y direction) of 5 mm×a thickness (Z direction) of 0.4 mm was produced, and the evaluation substrate was subjected to thermomechanical analysis by a compression method using a TMA test device (manufactured by DuPont Corporation, trade name: TMA2940). After mounting the evaluation substrate to the device in the X-direction, the substrate was measured twice in succession 5 g a load and at a temperature increasing rate of 10° C./min. The average coefficient of thermal expansion from 30° C. to 100° C. in the second measurement was calculated, and this was used as the value of the coefficient of thermal expansion.

(2) Copper Foil Bond Strength (Copper Foil Peel Strength)

The copper clad laminate was immersed in a copper etchant to form an outer copper layer having a width of 3 mm, and this one end was peeled off at the interface between the outer copper layer and the insulating layer and gripped by a gripper, and the adhesion (peel strength) of the copper foil was measured when peeled off at a pulling speed of about 50 mm/min in the vertical direction at room temperature using a tensile tester.

(3) Glass Transition Temperature (Tg)

By removing the copper foil by immersing the copper clad laminate in a copper etchant, an evaluation substrate having a length (X direction) of 5 mm×a width (Y direction) of 5 mm×a thickness (Z direction) of 0.4 mm was produced, and the evaluation substrate was subjected to thermomechanical analysis by a compression method using a TMA test device (manufactured by DuPont Corporation, trade name: TMA2940). After mounting the evaluation substrate to the device in the X-direction, the substrate was measured twice in succession under measurement conditions including a load of 5 g and a temperature increasing rate of 10° C./min. The Tg indicated by the intersection of the different tangents of the thermal expansion curves in the second measurement was determined and used as an index of heat resistance. The higher the Tg, the better the heat resistance.

(4) Flexural Modulus

The copper foil was removed by immersing the copper clad laminate in a copper etchant to prepare an evaluation substrate having a thickness of 50 mm×25 mm, and the flexural modulus of the evaluation substrate was measured using a universal testing machine "Tensilon UCT-5T" (manufactured by Orientech Co., Ltd.) at a crosshead speed of 1 mm/min and a span-to-span distance of 20 mm. The higher the value, the higher the rigidity.

(5) Desmear Weight Loss (Desmear Resistance)

The copper foil was removed by immersing the copper clad laminate in a copper etchant to prepare an evaluation substrate of 40 mm×40 mm, which was then desmeared by the process shown in Table A. A chemical solution manufactured by Attec Corporation was used. The weight reduction amount after desmear process relative to the dry weight before desmear treatment was calculated, and this was used as an index of desmear resistance. The smaller the desmear weight loss, the better the desmear resistance.

TABLE A

Desmear Process

| Process | Temperature (° C.) | Time (min) | Chemical Solution |
|---|---|---|---|
| Swelling | 70 | 5 | Swelling dip Secure Ligant P |
| Washing with water | room temperature | 2 | — |
| Roughening | 80 | 10 | Concentrate Compact CP |
| Washing with water | 50 | 2 | — |
| Neutralization | 40 | 5 | Reduction Solution Secure Ligant P500 |
| Washing with water | room temperature | 5 | — |

Preparation Example 1: Preparation of Amino-Modified Polyimide Resin (X-1)

A reaction vessel with a heating and cooling capacity of 2 liters equipped with a thermometer, a stirring device, and a water determination device with a refluxing cooling tube was charged with 72 g of both-terminal diamine-modified siloxanes (manufactured by Shin-Etsu Chemical Co., Ltd., trade name: X-22-161A, functional group equivalent weight of amino groups: 800 g/mol, component (b)), 252 g of bis(4-maleimidophenyl)methane (manufactured by K.I Chemical Industry Co., Ltd., trade name: BMI, component (c)), and 270 g of propylene glycol monomethyl ether, and reacted at 110° C. for 3 hours to obtain a solution containing an amino-modified polyimide resin (X-1).

Preparation Example 2: Preparation of Amino-Modified Polyimide Resin (X-2)

A reaction vessel with a heating and cooling capacity of 2 liters equipped with a thermometer, a stirring device, and a water determination device with a refluxing cooling tube was charged with 72 g of both-terminal diamine-modified siloxanes (manufactured by Shin-Etsu Chemical Co., Ltd., trade name: X-22-161B, functional group equivalent weight of amino groups: 1,500 g/mol, component (b)), 252 g of bis(4-maleimidophenyl)methane (manufactured by K.I Chemical Industry Co., Ltd., trade name: BMI, component (c)), and 270 g of propylene glycol monomethyl ether, and reacted at 110° C. for 3 hours to obtain a solution containing an amino-modified polyimide resin (X-2).

Examples 1 to 12 and Comparative Examples 1 to 6

The following components were mixed in the mixing ratios shown in Tables 1 to 3 (the unit of the numerical value in the table is parts by mass, and in the case of a solution, the amount in terms of solid content), and a uniform varnish having a solid content concentration of 65% by mass was produced using methyl ethyl ketone as a solvent. Next, this varnish was impregnated and coated on an E glass cloth having a thickness of 0.1 mm, and heated and dried at 160° C. for 10 minutes to obtain a prepreg for a coreless substrate having a content of a thermosetting resin composition of 48% by mass.

Four prepregs for coreless substrate were stacked, 12 μm electrolytic copper foils were placed up and down, and pressed at 2.5 MPa and 240° C. for 60 minutes to obtain a copper clad laminate. The evaluation results of the obtained copper clad laminate obtained according to the above measurement method are shown in Tables 1 to 3.

[(Meth)Acrylic Elastomer (a)]

SG-P3: epoxy group-containing acrylic polymer with a weight-average molecular weight of 850,000 [Nagase ChemteX Co., Ltd., trade name, epoxy number: 0.21 eq/kg (catalogue value)]

SG-80H: Acrylic polymer containing epoxy group and amide group with weight-average molecular weight of 350,000 [Nagase ChemteX Co., Ltd., trade name, epoxy number: 0.07 eq/kg (catalogue value)]

SG-600TEA: Acrylic polymer containing hydroxy groups with weight-average molecular weight of 1.2 million (manufactured by Nagase ChemteX Corporation, trade name, hydroxyl value: 20 mg KOH/g (catalogue value))

[Amine Compound Having at Least Two Primary Amino Groups (b)]

X-22-161A: both-terminal diamine-modified siloxanes (manufactured by Shin-Etsu Chemical Co., Ltd., trade name, functional group equivalent weight of amino group: 800 g/mol)

X-22-161B: Both-terminal diamine-modified siloxanes (manufactured by Shin-Etsu Chemical Co., Ltd., trade name, functional group equivalent weight of amino group: 1,500 g/mol)

[Maleimide Compound Having at Least Two N-Substituted Maleimide Groups (c)]

BMI: Bis(4-maleimidophenyl)methane (manufactured by K.I Chemical Industry Co., Ltd., trade name)

[Amino Modified Polyimide Resin (X)]

X-1: Solution containing amino-modified polyimide resin (X-1) prepared in Preparation Example 1

X-2: Solution containing amino-modified polyimide resin (X-2) prepared in Preparation Example 2

[Thermosetting Resin (d)]

NC-7000-L: α-naphthol/cresol novolac epoxy resin (manufactured by Nippon Kayaku Co., Ltd., trade name)

NC-3000-H: Biphenylalalkyl epoxy resin (manufactured by Nippon Kayaku Co., Ltd., trade name)

[Curing Accelerator (e)]

G-8009L: Isocyanate Mask Imidazole (manufactured by Daiichi Kogyo Pharmaceutical Co., Ltd., trade name)

TPP-S: Triphenylphosphine triphenylborane (manufactured by Hokko Chemical Industry Co., Ltd., trade name)

[Inorganic Filler (f)]

Spherical fused silica (average particle size: 0.5 μm)

TABLE 1

| | | Example 1 | Example 2 | Example 3 | Example 4 | Example 5 | Example 6 |
|---|---|---|---|---|---|---|---|
| Amino-Modified Polyimide Resin (X) | X-1 | | | | | | |
| | X-2 | | | | | | |
| (Meth)acrylic elastomer (a) | SG-P3 | 20 | | | 30 | 20 | 20 |
| | SG-80H | | 20 | | | | |
| | SG-600TEA | | | 20 | | | |

TABLE 1-continued

|  |  | Example 1 | Example 2 | Example 3 | Example 4 | Example 5 | Example 6 |
|---|---|---|---|---|---|---|---|
| Amine compound (b) | X-22-161A | 15 | 15 | 15 | 10 |  | 15 |
|  | X-22-161B |  |  |  |  | 15 |  |
| Maleimide compound (c) | BMI | 50 | 50 | 50 | 50 | 50 | 50 |
| Thermosetting resin (d) | NC-7000-L | 15 | 15 | 15 | 10 | 15 | 15 |
|  | NC-3000-H |  |  |  |  |  |  |
| Curing accelerator (e) | G-8009L | 1 | 1 | 1 | 1 | 1 |  |
|  | TPP-S |  |  |  |  |  | 1 |
| Inorganic filler (f) | Spherical fused silica | 150 | 150 | 150 | 150 | 150 | 150 |
| Results of the evaluations | (1) Thermal expansion ratio (ppm/° C.) | 6.5 | 6.7 | 6.3 | 6.2 | 6.3 | 6.5 |
|  | (2) Copper-foil Bonding Strength (kN/m) | 0.71 | 0.77 | 0.67 | 0.69 | 0.72 | 0.69 |
|  | (3) Glass transition temperature (° C.) | 270 | 270 | 270 | 270 | 275 | 275 |
|  | (4) Flexural modulus (GPa) | 17.2 | 17.5 | 16.9 | 16.8 | 17.0 | 17.3 |
|  | (5) Desmear Weight Loss (g/m$^2$) | 2.5 | 2.7 | 2.3 | 2.7 | 2.6 | 2.4 |

TABLE 2

|  |  | Example 7 | Example 8 | Example 9 | Example 10 | Example 11 | Example 12 |
|---|---|---|---|---|---|---|---|
| Amino-Modified Polyimide Resin (X) | X-1 | 65 | 65 | 65 | 65 | 65 |  |
|  | X-2 |  |  |  |  |  | 65 |
| (Meth)acrylic elastomer (a) | SG-P3 | 20 | 20 |  | 20 | 20 | 20 |
|  | SG-80H |  |  | 20 |  |  |  |
|  | SG-600TEA |  |  |  |  |  |  |
| Amine compound (b) | X-22-161A |  |  |  |  |  |  |
|  | X-22-161B |  |  |  |  |  |  |
| Maleimide compound (c) | BMI |  |  |  |  |  |  |
| Thermosetting resin (d) | NC-7000-L | 15 | 15 | 15 |  | 15 |  |
|  | NC-3000-H |  |  |  | 15 |  | 15 |
| Curing accelerator (e) | G-8009L | 1 | 1 | 1 | 1 |  |  |
|  | TPP-S |  |  |  |  | 1 | 1 |
| Inorganic filler (f) | Spherical fused silica | 100 | 150 | 150 | 150 | 150 | 150 |
| Results of the evaluations | (1) Thermal expansion ratio (ppm/° C.) | 7.1 | 6.5 | 6.7 | 6.6 | 6.5 | 6.6 |
|  | (2) Copper-foil Bonding Strength (kN/m) | 0.77 | 0.72 | 0.79 | 0.73 | 0.70 | 0.70 |
|  | (3) Glass transition temperature (° C.) | 270 | 270 | 270 | 275 | 275 | 280 |
|  | (4) Flexural modulus (GPa) | 16.6 | 17.3 | 17.6 | 17.4 | 17.3 | 17.4 |
|  | (5) Desmear Weight Loss (g/m$^2$) | 2.3 | 2.4 | 2.6 | 2.3 | 2.3 | 2.2 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| Amino-Modified Polyimide Resin (X) | X-1 |  |  |  | 65 |  |  |
|  | X-2 |  |  |  |  | 65 | 65 |
| (Meth)acrylic elastomer (a) | SG-P3 |  |  |  |  |  |  |
|  | SG-80H |  |  |  |  |  |  |
|  | SG-600TEA |  |  |  |  |  |  |
| Amine compound (b) | X-22-161A | 15 |  | 15 |  |  |  |
|  | X-22-161B |  | 15 |  |  |  |  |
| Maleimide compound (c) | BMI | 50 | 50 | 75 |  |  |  |
| Thermosetting resin (d) | NC-7000-L | 35 | 35 | 10 | 35 |  | 35 |
|  | NC-3000-H |  |  |  |  | 35 |  |
| Curing accelerator (e) | G-8009L | 1 | 1 | 1 | 1 | 1 |  |
|  | TPP-S |  |  |  |  |  | 1 |
| Inorganic filler (f) | Spherical fused silica | 150 | 150 | 150 | 150 | 150 | 150 |
| Results of the evaluations | (1) Thermal expansion ratio (ppm/° C.) | 8.3 | 8.1 | 7.3 | 8.3 | 8.1 | 8.3 |
|  | (2) Copper-foil Bonding Strength (kN/m) | 0.75 | 0.73 | 0.77 | 0.77 | 0.75 | 0.72 |
|  | (3) Glass transition temperature (° C.) | 230 | 235 | 280 | 230 | 235 | 235 |
|  | (4) Flexural modulus (GPa) | 19.1 | 18.7 | 19.6 | 19.1 | 19.3 | 19.2 |
|  | (5) Desmear Weight Loss (g/m$^2$) | 2.4 | 2.3 | 4.1 | 2.3 | 2.2 | 2.2 |

As is apparent from Tables 1 and 2, the copper clad laminates of Examples 1 to 12 obtained from the prepreg of the present invention are excellent in thermal expansion coefficient, copper foil adhesiveness, glass transition temperature, flexural modulus, and desmear weight reduction amount, and particularly excellent in copper foil adhesiveness. On the other hand, as is clear from Table 3, the copper clad laminates of Comparative Examples 1 to 5 in which the (meth)acrylic elastomer (a) is not used and the copper clad laminate of Comparative Example 6 in which the amine compound (b) is not used do not satisfy all the characteristics of the thermal expansion coefficient, the copper foil adhesiveness, the glass transition temperature, the bending elastic modulus and the desmear weight reduction amount at the same time, and in particular, the thermal expansion coefficient is inferior. Therefore, it can be seen that the prepreg of the present invention provides a laminate excellent in low thermal expansion and excellent in bonding strength with a metal circuit while maintaining excellent heat resistance and desmear resistance.

INDUSTRIAL APPLICABILITY

Since the prepreg of the present invention is excellent in low thermal expansion and excellent in bonding strength with a metal circuit while maintaining excellent heat resistance and desmear resistance, it is suitable for manufacturing printed wiring boards of high density and high multilayer, and is suitable for use in wiring boards of electronic devices used in computers, information device terminals, and the like that process large amounts of data at high speed.

REFERENCE SIGNS LIST

1 Support (core substrate)
2 Prepreg (insulating layer)
3 Via hole
4 Circuit pattern
5 Build-up layer
6 Coreless substrate

The invention claimed is:

1. A prepreg for a coreless substrate, comprising a thermosetting resin composition containing (a) (meth)acrylic elastomer, (b) an amine compound having at least two primary amino groups, and (c) a maleimide compound having at least two N-substituted maleimide groups.

2. The prepreg for a coreless substrate according to claim 1, wherein the content of (meth)acrylic elastomer (a) is 1 to 60 parts by mass with respect to 100 parts by mass of a solid content of the resin component in the thermosetting resin composition.

3. The prepreg for a coreless substrate according to claim 1, wherein the (meth)acrylic elastomer (a) has one or more reactive functional groups selected from the group consisting of an epoxy group, a hydroxy group, a carboxy group, an amino group, and an amide group.

4. The prepreg for a coreless substrate according to claim 1, wherein the thermosetting resin composition further contains (d) a thermosetting resin.

5. The prepreg for a coreless substrate according to claim 1, wherein the thermosetting resin composition further contains (e) a curing accelerator.

6. The prepreg for a coreless substrate according to claim 1, wherein the thermosetting resin composition further contains (f) an inorganic filler.

7. A coreless substrate comprising an insulating layer formed using the prepreg for a coreless substrate according to claim 1.

8. A semiconductor package comprising a semiconductor element mounted on the coreless substrate according to claim 7.

9. A method of manufacturing a coreless substrate in which a build-up layer is formed on a support and then the build-up layer is separated from the support,
wherein the build-up layer is formed by alternately stacking insulating layers and conductive layers, and
at least one layer of the insulating layers is formed using the prepreg for a coreless substrate according to claim 1.

* * * * *